United States Patent [19]

Englmeier

[11] Patent Number: 4,760,535
[45] Date of Patent: Jul. 26, 1988

[54] CONTROL CIRCUIT FOR TUNING A HIGH-FREQUENCY INPUT CIRCUIT

[75] Inventor: Martin Englmeier, Lenting, Fed. Rep. of Germany

[73] Assignee: Telefunken electronic GmbH, Heilbronn, Fed. Rep. of Germany

[21] Appl. No.: 699,403

[22] Filed: Feb. 7, 1985

[30] Foreign Application Priority Data

Feb. 21, 1984 [DE] Fed. Rep. of Germany ....... 3406150

[51] Int. Cl.$^4$ ............................ H03J 3/10; H03J 3/16; H03J 3/28
[52] U.S. Cl. ...................................... 364/480; 334/14; 358/195.1; 455/186; 455/197
[58] Field of Search ...................... 364/480; 358/195.1, 358/197; 330/278, 284; 307/522; 334/14–16; 331/10, 11, 19, 25, DIG. 2; 455/182–187, 188, 195, 197

[56] References Cited

U.S. PATENT DOCUMENTS

| 4,270,220 | 5/1981 | Hagiwara et al. | 455/182 |
| 4,302,778 | 11/1981 | Tanaka | 358/195.1 |
| 4,305,157 | 12/1981 | Mogi | 455/183 |
| 4,361,908 | 11/1982 | Niimi | 358/195.1 |
| 4,368,541 | 1/1983 | Evans | 455/186 |
| 4,399,559 | 8/1983 | Theriault | 334/15 |
| 4,402,089 | 8/1983 | Knight et al. | 455/186 |
| 4,481,673 | 11/1984 | Muterspaugh | 455/186 |
| 4,542,533 | 9/1985 | Parker | 455/182 |
| 4,593,411 | 6/1986 | Schiller | 455/185 |

FOREIGN PATENT DOCUMENTS

| 2814577 | 11/1979 | Fed. Rep. of Germany . |
| 2834231 | 2/1980 | Fed. Rep. of Germany . |
| 2854852 | 7/1980 | Fed. Rep. of Germany . |
| 3234236 | 3/1983 | Fed. Rep. of Germany . |
| 1177826 | 1/1970 | United Kingdom . |
| 2105935 | 3/1983 | United Kingdom . |
| 2137447 | 10/1984 | United Kingdom . |

OTHER PUBLICATIONS

Electronics, "Microcomputer Tunes and Holds Frequencies", Sep. 29, 1977, vol. 50, No. 20, pp. 46–50.
Rinderle et al, Integrierte Schaltkreise für Rundfunkempfänger mit elektronischer Senderwahl, Nachrichten Elektronik, Nov. 1979 (Germany) pp. 365–368.

Primary Examiner—Felix D. Gruber
Attorney, Agent, or Firm—Spencer & Frank

[57] ABSTRACT

A control circuit for tuning a high-frequency input circuit comprises, in addition to a first adjustable component 5 which is directly controlled by a control voltage, further adjustable components 6, 10 which are likewise under the influence of a control voltage UD and UR, respectively. In order to enable individual alignment of the further components in a simple manner, there is fed to the further controllable components 6, 10 via an electronic circuit arrangement 7 one correction voltage each, which supports or weakens the control voltage in its effect and effects the respectively required alignment. The correction voltages are dependent upon the control voltage UD which is fed solely to the first adjustable component 5.

28 Claims, 3 Drawing Sheets

CONTROL CIRCUIT FOR TUNING A HIGH-FREQUENCY INPUT CIRCUIT

BACKGROUND OF THE INVENTION

1. Field of the Invention

The invention relates to a control circuit for tuning a high-frequency input circuit in dependence upon a control voltage which directly controls a first adjustable component and at least indirectly at least one further adjustable component, in particular, for tuning a tuner for high-frequency equipment with an oscillator and at least one preceding preselection circuit, which are controlled in dependence upon a tuning control voltage, and, if necessary, with an amplification control voltage fed to an amplifier component, and with electronic tuning voltage control means and electronic stores.

2. Description of the Prior Art

In a known control circuit of this kind (German Offenlegungsschrift No. 2 854 852) for a tuner of television sets, the oscillator of the tuner is tuned in a PLL circuit. Subsequently, the individual preceding oscillating circuits which are to be tuned are switched over as further components via additional circuit arrangements into auxiliary oscillators which are again individually tuned successively via the PLL circuit with an altered divider ratio. In this case, the control voltage respectively derived from the tuning of the auxiliary oscillators is stored in analog stores as long as no change in the receiving frequency is desired. With this control circuit it is therefore necessary to directly engage the oscillating circuits preceding the oscillator in order to be able to switch them over as auxiliary oscillators. In addition to the substantial additional circuitry expenditure, there is also the danger of a mistuning of the oscillating circuits having occurred after the auxiliary oscillator circuitry has been switched off. Furthermore, the entire tuning voltage required for the tuning of the further components must be changed, for which purpose correspondingly variable voltage sources with the associated control range must be provided.

SUMMARY OF THE INVENTION

The above and other objects are achieved, according to the present invention, in a control circuit for tuning a high-frequency input circuit, the input circuit having a first component and at least one further component, each component having an adjustable frequency characteristic, and the input circuit being connected to receive a tuning control voltage for directly controlling the first component and at least indirectly controlling the at least one further component, by the improvement wherein the control circuit comprises electronic tuning voltage control means and electronic stores connected for supplying to each further component a respective correction voltage for adjusting the frequency characteristic of each further component in a manner which is separate from the control effected by the tuning control voltage.

In a control circuit designed according to the invention, the alignment and the tuning are therefore effected roughly by the usual control voltage controlling the oscillator, while the fine alignment is performed by respective correction voltages individually tuned to the individual tunable resonant circuits. Amplification control may also be carried out in a similar manner by feeding a corresponding correction voltage to an amplification control voltage. The correction voltages are relatively small compared to the main voltages and may thus be represented in a simple manner by conventional circuit means. Since, in this case, the intervention is direct-current related, it is not necessary to engage the components determining the frequency. After manufacture of the circuit arrangement, the further components determining the frequency therefore do not or only in rare cases have to be aligned by mechanical bending of the inductors.

According to an advantageous embodiment, there are filed within a processor in a store under fixed addresses pertaining to individual predetermined values within the modification range of the control voltage, associated digital words which are issued successively as respective common momentary control voltage for a first alignment to the components determining the frequency, i.e., to tuning diodes. For each control voltage issued, the necessary correction voltages are then generated at the individual components and stored in groups under the respective fixed address in a further store at corresponding store locations. The initial factorytype alignment for taking into account alignment irregularities in the components which determine the frequency is thus registered and is therefore available at any time for tuning in ordinary application. For this application, the control voltage required for aligning the oscillator is then converted via an analog/digital converter into a digital word corresponding to the current value which is then taken over as comparison address. This comparison address is compared to the two fixed addresses neighboring in value, via which fixed control voltages are issued in factory-type alignment, and the correction values stored for these fixed addresses are interpolated in the relationship of the addresses to one another. The digital word obtained from this interpolation is then issued as correction voltage. For each fixed address a number of correction values corresponding to the number of the further components are stored and issued successively to the associated further components. Not only the correction values stored for the fixed addresses may thereby be issued but also intermediate values through the interpolation, with the result that the alignment after manufacture may be limited to a few points in the tuning range, and the correction voltages may be brought sufficiently close to the values actually required in dependence upon the level of the control voltage throughout the entire modification range of the control voltage.

DESCRIPTION OF THE PREFERRED EMBODIMENTS

Figure 1:
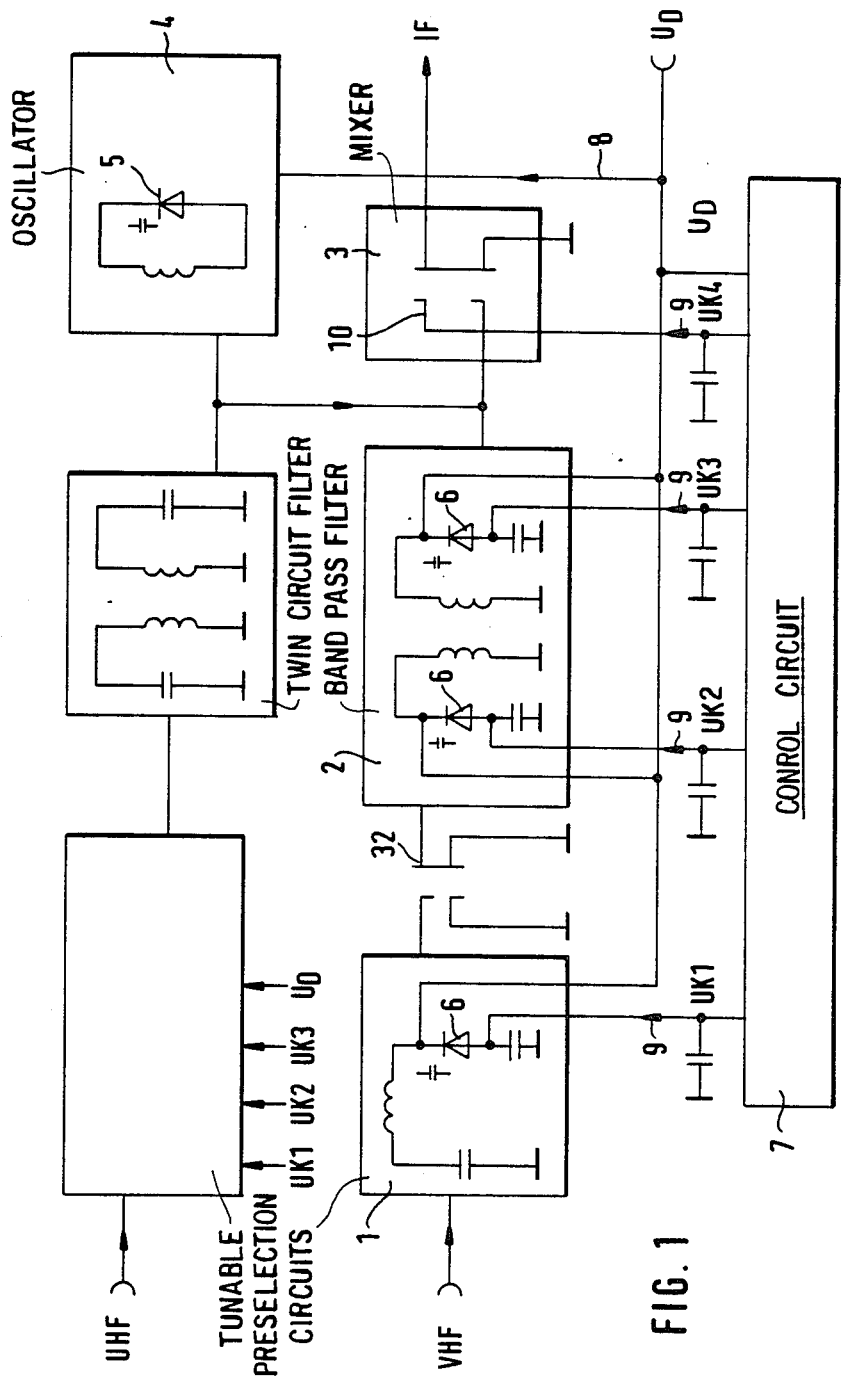
FIG. 1 shows a high-frequency input circuit connected to a control circuit according to the invention.

A high-frequency input circuit comprises a tunable preselection circuit 1, a twin-circuit band-pass filter 2, a mixer stage 3 and an oscillator 4. The oscillating circuit of the oscillator 4 has a first adjustable component 5 in the form of a capacitive tuning diode. Associated with the frequency tuned resonant circuits of the preselection circuit 1 and the band-pass filter 2 are further corresponding adjustable components 6 whose capacitance value may be controlled by modifying a control voltage UD. The control voltage UD is fed solely to the first adjustable component 5 in the oscillator circuit and also feeds the further controllable components 6. In addition, there is provided for the mixer stage 3, an amplification control correction voltage UK4. Also provided is a control circuit 7 with electronic tuning voltage control means and electronic analog stores. Line 8 for the control voltage UD is connected to the control circuit 7. Further lines 9 provide a direct-current connection between the further components 6 or the mixer stage 3 and the circuit 7, respectively. These further lines 9 are provided for correction voltages UK1, UK2, UK3 and UK4. These correction voltages UK1 ... UK4 are fed to the further components 6 or the transistor 10 of the mixer stage 3, respectively, for modifying the circuit resonant frequency or the amplification factor, respectively. The correction voltages UK1 ... UK3 are of such dimensions that for a resonant frequency solely determined by the control voltage UD, the frequency range of the high-frequency input stage required for the respective purpose results as an intermediate frequency. The correction voltages UK1 ... UK3 may be oppositely connected to the control voltage UD or support it. The correction voltage UK4, on the other hand, is of such dimensions that uniform amplification is produced throughout the tuning range of the input circuit.

Figure 2:
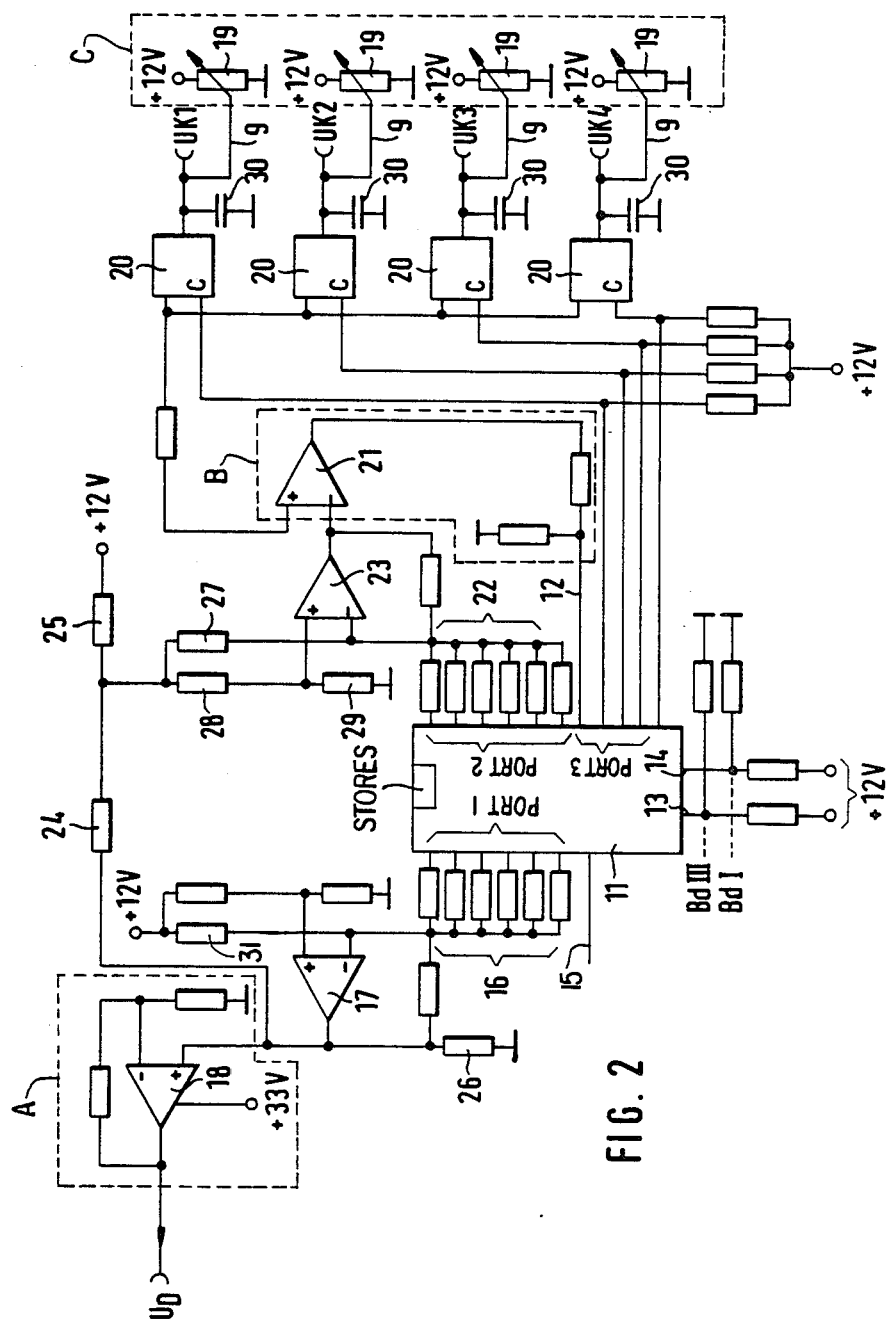
FIG. 2 shows one embodiment of a control circuit according to the invention for storing correction values for alignment during the manufacturing process.

One embodiment of the control circuit 7, configured for the initial alignment of the high-frequency input circuit, is shown in FIG. 2. It contains a processor 11 which comprises various ports 1, 2, 3 suited for the input and/or output of data, a stop signal input 12, and inputs 13 and 14 for the input of frequency range characteristic data. Within the processor 11 there is a store in which digital words corresponding to individual, predetermined values within the modification range of the control voltage UD are stored under fixed addresses. These predetermined values may be the lowest and the highest value, and one or several values of the control voltage UD located between these. Corresponding to these digital words which may be called up from the processor, there is issued for the initial alignment of the input circuit at port 1 one digital word respectively, which is converted into a voltage corresponding to the predetermined value via a first R/2R resistance ladder 16. This voltage proportional to the control voltage UD is amplified via a first operational amplifier 17 and a second operational amplifier 18 up to the control voltage UD corresponding to the respectively issued digital word actually required. The amplification factor of these operational amplifiers 17 and 18 is always identical. The individual predetermined values of the control voltage UD produced thereby are fed to the further controllable components 6, 10 according to FIG. 1 during the initial alignment. For each of the predetermined values of the control voltage UD, the frequency of the oscillator 4 is directly determined therefrom. To achieve an optimal alignment of the band-pass characteristic of the input circuit it is then necessary to adjust the further components 6 for each value in such a way that the correct value is produced at the intermediate frequency output IF for the oscillator frequency. To this end, there is connected to these further components 6 in the simplest form via one potentiometer 19 each, a correction voltage UK1 ... UK3 which modifies the further component 6 until the required alignment is obtained. The correction voltage UK4 is also set so as to attain a required amplification factor for the input signal. The lines 9 are connected to one analog switch 20 each, whose second terminal of the circuit path is commonly connected to the positive input of a comparator 21. The control inputs C of the analog switches 20 serve the purpose of opening or closing the circuit paths and each switch 20 is connected to one line of a port 3 of the processor 11. Via the lines of port 3, the individual analog switches 20 are closed successively for each individual predetermined value of the control voltage issued via port 1, so that the respective values of the correction voltage UK1 ... UK4 also reach the input of the comparator 21 successively. If one of the correction voltages UK1 ... UK4 is present, a signal is sent via the output of the comparator 21 to the stop signal input 12 until via the second R/2R resistance ladder 22 connected to port 2, and a following third operational amplifier 23, a counter input signal equal to the positive input occurs at the negative input of the comparator. Via the stop signal input 12, a counter is initiated to generate for the respective fixed address under which the digital word for the predetermined current value of the issued control voltage is filed, a further digital word whose issued analog value constantly rises or drops until compensation is attained. When compensation has been effected, further generation of the further digital word is stopped and the attained further digital word is stored in a store location of a further store of the processor 11 as a correction value corresponding to the correction voltage UK1 applied. For the fixed address, the remaining correction voltages UK2-4 are also successively applied to the comparator 21 via port 3, and the further respectively generated digital word is stored in a further store location associated with the fixed address. The processor 11 may be subsequently connected to a further fixed address in order to issue another of the predetermined values in the modification range of the control voltage UD. For each of these fixed addresses, the storage of the correction voltages UK1 ... UK4 is then repeated at further store locations. In order to make the stop voltages dependent on the height of the control voltage issued, a desired value voltage changing proportionally with the control voltage UD is predetermined for the second input of the operational amplifier 23 via resistors 24, 25, 27. Resistor 24 is connected to the output of the operational amplifier 17 which amplifies the current control voltage issued by the processor 11. The resistance ladder 22 is also fed by this voltage which is proportional to the control voltage UD since resistor 27 is connected to resistor 24. At a low control voltage UD, correspondingly small changes of the analog voltage issued will therefore also occur at the resistance ladder 22 with each modification step of the digital word issued at port 2. With increasing height of the control voltage UD, the step voltages are also correspondingly increased. An optimal alignment precision throughout the modification range of the control voltage is thereby attained.

If the high-frequency input circuit may be switched ever to several frequency ranges to be tuned, frequency range characteristic data are then entered additionally via the inputs 13 and 14. To this end, the fixed addresses are assigned corresponding tape marker bit models via inputs 13 and 14, so that there may be allocated to a first frequency range, e.g., VHF 1, a first number of fixed addresses to which corresponding control voltages are issued. By switching over the control signals at inputs 13 and 14, digital words again distributed throughout the modification range of the control voltage may be stored for further frequency ranges, e.g., VHF III pertaining to correspondingly characterized further fixed addresses. Taking into account these tape marker bit models, the correction values are then also stored under corresponding different store locations.

Follwing this alignment of the further components 6 and 10, respectively, which is to be carried out once, the input circuit is suitable, for example, for use in a television set after storage of the data required for the alignment.

Figure 3:
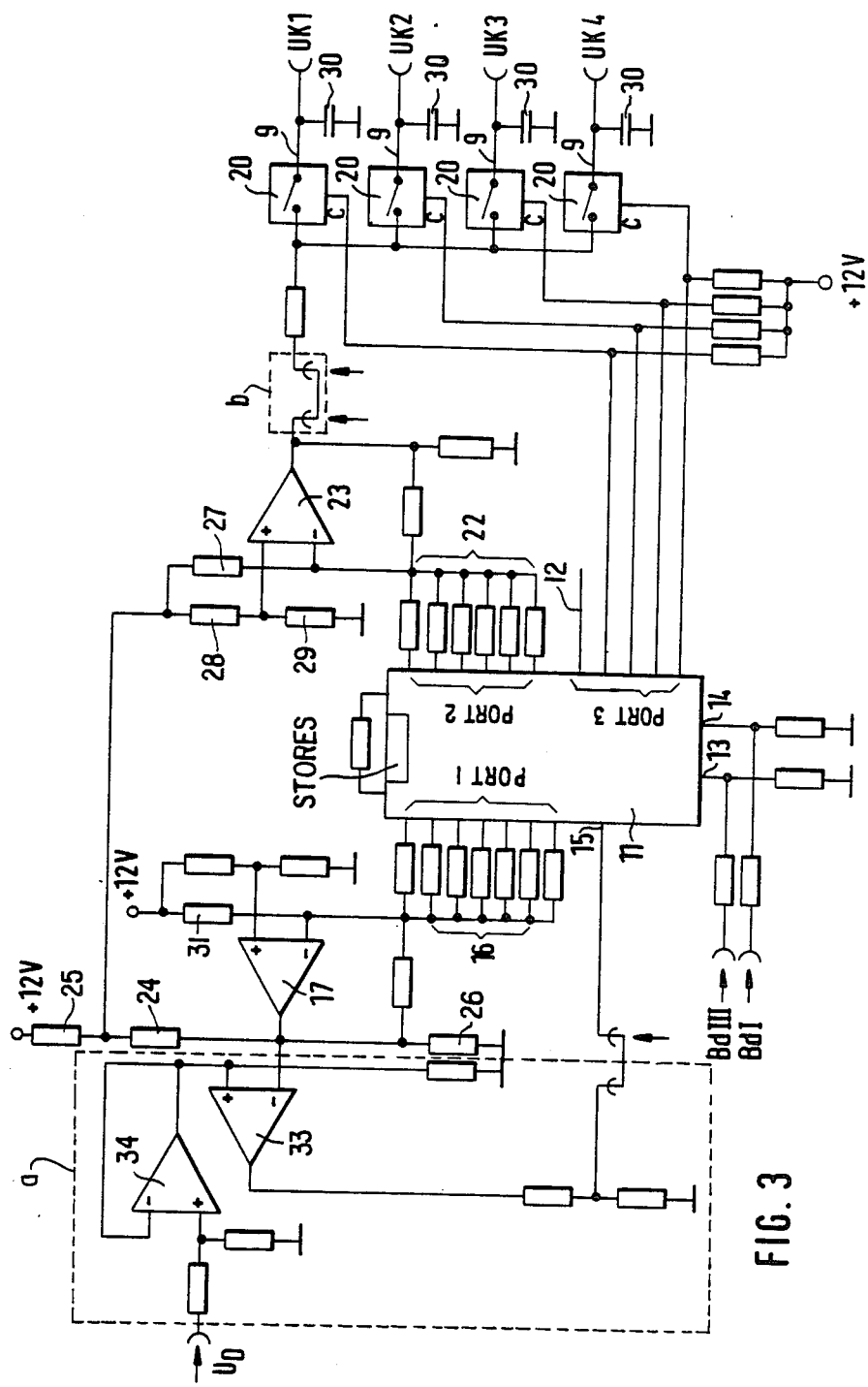
FIG. 3 shows the control circuit of FIG. 2 altered for the tuning of a high-frequency input circuit in normal operation.

After alignment and storage of data, the components enclosed in boxes A, B and C of FIG. 2 are disconnected and, to place the circuit in a configuration for use in the television set, the components enclosed in boxes a and b of FIG. 3 are connected.

During use of a control circuit aligned in such a way, the second operational amplifier 18, the potentiometers 19, and the comparator 21 of FIG. 2 are removed from the control circuit so that the circuit then has the form shown in FIG. 3. Instead of comparator 21, a direct connection is then formed from the output of the third operational amplifier 23 to the common connections of the analog switches 20, whereas the control input 15 is located at the output of a fourth operational amplifier 33. The operational amplifier 18 is replaced by the fourth operational amplifier 33, whose negative input is connected to the output of the operational amplifier 17, whereas the positive input is connected to the output of an impedance converter 34 which is fed by the control voltage UD then generated externally. The control voltage may, for example, be generated by a PLL circuit in a known manner. The impedance converter 34 decreases the control voltage UD by the factor by which the operational amplifier 18 has amplified the voltage issued via port 1. The operational amplifier 33 now operates as comparator whose output is connected to the control input 15 of the processor 11. While there is a signal at the output of the operational amplifier 33 a counter is started via input 15 and generates a digital word which changes step-wise and is to be issued via port 1. This digital word is converted at the first resistance ladder 16 to an analog signal which reaches the comparator 33 via the operational amplifier 17. As soon as compensation is reached here, the counter is stopped via input 15, and the digital word generated hitherto is retained. This digital word which corresponds to the control voltage UD currently at the impedance converter 34, is taken over as comparison address. This comparison address is then compared with the two fixed addresses which are closest to it with respect to value. In accordance with the proportion by which this comparison address deviates from the neighboring fixed addresses, the correction values stored for the corresponding fixed addresses are put into proportion, and a correction value corresponding to the comparison address is produced therefrom. In accordance with the relationship formed between the comparison address and the fixed addresses, corresponding interpolation of the associated correction values enables calculation of a correction value associated with the comparison address. This correction value gained from the interpolation is issued as digital word via port 2 and, following an analog conversion at the second resistance ladder 22 is connected via the operational amplifier 23 to the contacts of analog switches 20 which face away from the lines 9. The interpolation is effected successively for the individually filed correction values for the correction voltages UK1 . . . UK4. The processor 11 also switches through the associated analog switch 20 when the interpolated correction value for the correction voltage UK1 is issued via port 3, so that the correction voltage issued by the operational amplifier 23 is fed to an electric store in the form of a capacitor 30 which feeds the associated further component 6. Subsequently, in a further interpolation with the same proportional value, the processor 11 acquires from the correction values filed for the correction voltage UK2 the interpolated correction value corresponding to the comparison address and issues it again via the resistance ladder 22 and the operational amplifier 23. In this case, however, the analog switch 20 associated with the correction voltage UK2 is switched through, whereas the remaining analog switches 20 are connected to high resistance. Here, too, as with the remaining correction voltages UK1, 3 and 4, the issued correction voltage is electrically stored at a capacitor 30. By means of the interpolation it is thus possible to generate a corresponding correction voltage for the further components 6, 10 throughout the entire modification range of the control voltage, although only individual values are stored throughout the modification range. The issuing of the correction voltages UK1 . . . UK4 relating to the respective current comparison address is cyclically repeated by the processor 11 in order to compensate for any losses at the capacitors 30 or the further components 6, 10, respectively. Here, too, the resistance ladder 22 as well as the further input of the operational amplifier 23 are fed by the voltage at the output of the operational amplifier 17 that is proportional to the control voltage UD in order that the stored digital values again generate the same values to be issued. By switching over the control signals at inputs 13, 14 the fixed addresses associated with the individual frequency bands may furthermore be characterized again, and the pertaining correction voltage values may be issued. The respective counter, the associated R/2R resistance ladder 16 or 22, respectively, and the operational amplifier 23 and comparator 33 connected downstream therefrom form approximation registers whose digital word derived from the approximation form the comparison address or the correction value, respectively.

The control voltage UD is cyclically interrogated by the processor 11. Following each inquiry, the current digital word derived from the control voltage UD is compared to the digital word of the previous inquiry. If a change in the current digital word has occurred, new correction voltage values are calculated and issued. If no change has occurred, the correction voltage values to be issued are not brought up to date, and, in particular, they are not newly calculated. In this case, the correction voltages are issued in shortened cycle times.

The correction voltages may, during the first alignment, not only be generated via alterable resistors 19, other adjustable voltage sources may equally well be employed. These voltage sources may be adjusted automatically in dependence upon the frequency range measured at the IF output, with, in particular, the control being effected via a self-aligning measuring set-up.

The resistance ladders 16, 22 consist of single resistors which are connected at one end to one line each of ports 1 and 3, respectively, and whose second ends are respectively connected to one another. The resistor having the lowest resistance is always associated with the highest-value line of ports 1 and 3, respectively, whereas the next lines have one associated resistor each whose resistance value is twice as high as that of the resistor connected to the preceding line. The combined ends of the resistance ladders 16, 22 are connected to one input each of the operational amplifier 17 and 23, respectively, and they are connected to a supply voltage via supply resistors 31 and 27, respectively. Switches which, in principle, are controllable and are connected at one end to ground, are connected to the lines of the ports in the processor 11.

What is claimed is:

1. In a control circuit for tuning a high-frequency input circuit, the input circuit having a first component and at least one further component, each having an adjustable frequency characteristic, and the input circuit being connected to receive a tuning control voltage for directly controlling the first component and at least indirectly controlling the at least one further component, the improvement wherein said control circuit comprises electronic tuning voltage control means and electronic stores connected for supplying to said at least one further component a correction voltage for adjusting the frequency characteristic of the at least one further component in a manner which is separate from the control effected by the tuning control voltage, wherein the input circuit is a tuner for high frequency equipment, the first component is a tunable oscillator and the at least one further component is a tunable preselection circuit.

2. A control circuit as defined in claim 1 wherein said at least one further component includes two such further components one of which is constituted by an amplifier and said control circuit supplies to the amplifier a correction voltage for controlling the amplification factor of the amplifier.

3. In a control circuit for tuning a high-frequency input circuit, the input circuit having a first component and at least one further component, each having an adjustable frequency characteristic, and the input circuit being connected to receive a tuning control voltage for directly controlling the first component and at least indirectly controlling the at least one further component, the improvement wherein said control circuit comprises:

electronic tuning voltage control means and electronic stores connected for supplying to said at least one further component a correction voltage for adjusting the frequency characteristic of the at least one further component in a manner which is separate from the control effected by the tuning control voltage, and a processor having: first store means containing memory locations having fixed addresses, each fixed address being associated with a respective selected value of the tuning control voltage and each memory location storing a digital word representative of the associated voltage value; means for supplying to said first component and to said at least one further component a tuning control voltage having a value corresponding to each digital word for effecting initial alignment of the components; and correction voltage establishing means, including second store means containing memory locations having addresses corresponding to the fixed addresses of said first store means, for generating, for each selected tuning voltage value, a correction voltage for each further component and storing a representation of each correction voltage for each further component at a selected memory location of said second store means having an address corresponding to the fixed address of said first store means associated with the respective selected tuning control voltage value.

4. A control circuit as defined in claim 3 wherein the correction voltages for the further components are established successively by said correction voltage establishing means and are stored in said second store means in the form of digital words constituting correction values.

5. A control circuit as defined in claim 3 further comprising an R/2R resistance ladder connected for converting each digital word in said first memory means into a tuning control voltage value and for supplying each tuning control voltage value to each further component.

6. A control circuit as defined in claim 3 wherein said correction voltage establishing means comprise: means for producing a variable correction voltage for aligning each further component; a comparator having first and second inputs and an output; a plurality of switches each connected for selectively applying the variable correction voltage for one further component to said first input of said comparator; and counter means connected to said comparator for generating successive digital values; digital/analog converter means for generating an analog representation of each digital value produced by said counter connected for supplying the analog representation to said second comparator input, wherein said counter means are operative to cease counting when said comparator output produces a signal indicative of a comparison between the signals at said first and second inputs and to transfer the digital value then provided by said counter to a selected memory location of said second store means as a correction voltage representation.

7. A control circuit as defined in claim 6 wherein said digital/analog converter means comprise an R/2R resistance ladder connected between said counter and said second comparator input and further connected to receive the tuning control voltage.

8. Control circuit according to claim 3 wherein tape marker bit models are associated with the fixed addresses of said first store means for multiple exploitation of the modification range of the tuning control voltage for several tunable frequency bands.

9. In a control circuit for tuning a high-frequency input circuit, the input circuit having a first component and at least one further component, each having an adjustable frequency characteristic, and the input circuit being connected to receive a tuning control voltage for directly controlling the first component and at least indirectly controlling the at least one further component, the improvement wherein said control circuit comprises electronic tuning voltage control means and electronic stores connected for supplying to said at least one further component a correction voltage for adjusting the frequency characteristic of the at least one further component in a manner which is separate from the control effected by the tuning control voltage, wherein the tuning control voltage is supplied to the input circuit and to said control circuit, and said control circuit comprises: first store means having a plurality of memory locations each having a fixed address and each associated with a respective selected tuning control voltage value; second store means for each further component having a plurality of memory locations each having an address associated with a respective fixed address of said first store means, each memory location of said second store means containing a representation of the correction voltage to be supplied to the associated further component when the tuning control voltage has the value associated with the corresponding respective fixed address of said first store means; converter means for deriving a comparison address representative of the value of the tuning control voltage being supplied to said control circuit, and for comparing the comparison address with the two fixed addresses associated with the tuning control voltage values adjacent the value of the tuning control voltage being supplied; and correction voltage generating means connected for forming, for each further component, a correction voltage by interpolation between the correction voltage representations stored at the memory locations whose addresses are associated with the two fixed addresses of said first store means associated with the tuning control voltage values adjacent the value being supplied, and based on the relation between the comparison address and the two fixed addresses.

10. A control circuit as defined in claim 9 further comprising a processor controlling said store means and said converter means.

11. A control circuit as defined in claim 10 further comprising an analog switch for each further component connected between its associated further component and said correction voltage generating means and controlled by said processor for selectively supplying the corresponding correction voltage to its associated further component.

12. A control circuit as defined in claim 11 wherein said correction voltage generating means comprise: a R/2R resistance ladder connected for deriving the correction voltage from a corresponding digital representation; an operational amplifier having first and second inputs and an output, with said first input being connected to said ladder, said second input being connected to receive a voltage proportional to the tuning control voltage, and said output being connected to each analog switch; and means supplying the voltage proportional to the tuning control voltage to said ladder.

13. A control circuit as defined in claim 9 wherein there is a plurality of further components and said control circuit further comprises: switching means for cyclically applying to each further component its associated correction voltage; and electrical storage means connected to each further component for storing the correction voltage associated with that further component.

14. A control circuit as defined in claim 9 further comprising: an operational amplifier having a first input connected to receive a voltage proportional to the tuning control voltage being supplied, a second input and an output; an analog/digital converter connected to the output of said amplifier for producing a corresponding digital signal; a counter representative of the digital signal; an R/2R resistance ladder connected to said counter for producing an analog signal representative of the count output of said counter and connected to said second input of said counter for supplying an analog signal as a compensation signal; and means for halting said counter when the signals at said first and second inputs are equal, whereupon the count signal from said counter serves as the comparison address.

15. A control circuit according to claim 14 wherein the counter, the associated R/2R resistance ladder and the operational amplifier constitute an approximation register whose digital word obtained from the approximation constitutes the comparison address.

16. A control circuit according to claim 9 wherein additional tape marker bit models which designate different frequency ranges are associated with the digital words obtained from the control voltage, and, for each frequency range pertaining to individual fixed voltage values of the control voltage, corresponding, range-related digitalized correction voltage values are filed in said second store means.

17. A control circuit as defined in claim 9 further comprising a processor for periodically deriving a digital word representing the value of the tuning control voltage being supplied and comparing each digital word with that previously derived, and operative for modifying the value of each correction voltage only if a change occurs in the derived digital word.

18. In a control circuit for tuning a high-frequency input circuit, the input circuit having a first component and at least one further component, each having an adjustable frequency characteristic, and the input circuit being connected to receive a tuning control voltage for directly controlling the first component and at least indirectly controlling the at least one further component, the improvement wherein said controlcircuit comprises:
electronic tuning voltage control means and electronic stores connected for supplying to said at least one further component a correction voltage for adjusting the frequency characteristic of the at least one further component in a manner which is separate from the control effected by the tuning control voltage, and
an adjustable voltage source for producing each correction voltage.

19. A control circuit as defined in claim 18 wherein each said source comprises an adjustable resistor.

20. A control circuit as defined in claim 18 wherein each said source is constructed to be set automatically.

21. A control circuit as defined in claim 20 wherein each said source is constructed to be adjusted by a selfaligning measuring system.

22. In a control circuit for tuning a high-frequency input circuit, the input circuit having a first component and at least one further component, each having an adjustable frequency characteristic, and the input circuit being connected to receive a tuning control voltage for directly controlling the first component and at least indirectly controlling the at least one further component, the improvement wherein said control circuit comprises electronic tuning voltage control means and electronic stores connected for supplying to said at least one further component a correction voltage for adjusting the frequency characteristic of the at least one further component in a manner which is separate from the control effected by the tuning control voltage, wherein the input circuit further includes a controllable amplifying stage and one correction voltage is supplied to the amplifying stage for controlling the amplification produced by that stage.

23. In a control circuit for tuning a high-frequency input circuit, the input circuit having a first component and at least one further component, each having an adjustable frequency characteristic, and the input circuit being connected to receive a tuning control voltage for directly controlling the first component and at least indirectly controlling the at least one further component, the improvement wherein said control circuit comprises electronic tuning voltage control means and electronic stores connected for supplying to said at least one further component a correction voltage for adjusting the frequency characteristic of the at least one further component in a manner which is separate from the control effected by the tuning control voltage, wherein said at least one further component supplied with a correction voltage is a capacitive tuning diode of a resonant circuit.

24. In a control circuit for tuning a high-frequency input circuit, the input circuit having a first component and at least one further component, each having an adjustable frequency characteristic, and the input circuit being connected to receive a tuning control voltage for directly controlling the first component and at least indirectly controlling the at least one further component, the improvement wherein said control circuit comprises electronic tuning voltage control means and electronic stores connected for supplying to said at least one further component a correction voltage for adjusting the frequency characteristic of the at least one further component in a manner which is separate from the control effected by the tuning control voltage, wherein said at least one further component is a tuning diode having a cathode connected to receive the tuning control voltage and an anode connected to receive an associated correction voltage.

25. A process for factory alignment of a high- frequency input circuit which is connected to a control circuit for tuning the high-frequency input circuit, the input circuit having a first component and at least one further component, each component having an adjustable frequency characteristic, and the input circuit being connected to receive a tuning control voltage for directly controlling the first component and at least indirectly controlling the at least one further component, the control circuit further including electronic tuning voltage control means and electronic stores connected for supplying to the at least one further component a correction voltage for adjusting the frequency characteristic of the at least one further component in a manner which is separate from the control effected by the tuning control voltage, said process comprising: supplying a tuning control voltage from the control circuit to the first component and to the at least one further component; varying the tuning control voltage between successive selected values; for each value of the tuning control voltage, supplying a correction voltage to each further component and varying each correction voltage until the input circuit is aligned; and storing, in digital form, for each tuning control voltage value, the correction voltage supplied to each further component at the time the input circuit is aligned.

26. A process for tuning a high-frequency input circuit which is connected to a control circuit, the input circuit being tuned by means of the control circuit, the input circuit having a first component and at least one further component, each component having an adjustable frequency characteristic, and the input circuit being connected to receive a tuning control voltage for directly controlling the first component and at least indirectly controlling the at least one further component, the control circuit further including electronic tuning voltage control means and electronic stores connected for supplying to the at least one further component a correction voltage for adjusting the frequency characteristic of the at least one further component in a manner which is separate from the control effected by the tuning control voltage, wherein the tuning control voltage is supplied to the input circuit and to the control circuit, and the control circuit further includes: first store means having a plurality of memory locations each having a fixed address and each associated with a respective selected tuning control voltage value; second store means for each further component having a plurality of memory locations each having an address associated with a respective fixed address of the first store means, each memory location of the second store means containing a representation of the correction voltage to be supplied to the associated further component when the tuning control voltage has the value associated with the corresponding respective fixed address of the first store means; converter means for deriving a comparison address representative of the value of the tuning control voltage being supplied to the control circuit, and for comparing the comparison address with the two fixed addresses associated with the tuning control voltage values adjacent the value of the tuning control voltage being supplied; and correction voltage generating means connected for forming, for each further component, a correction voltage by interpolation between the correction voltage representations stored at the memory locations whose addresses are associated with the two fixed addresses of the first store means associated with the tuning control voltage values adjacent the value being supplied, and based on the relation between the comparison address and the two fixed addresses, and wherein the first component of the input circuit is a controllable oscillator, said process comprising: supplying the tuning control voltage to the oscillator; deriving, from the tuning control voltage, a comparison address; deriving, by interpolation, from the correction value representations at the memory locations of the second store means which are closest to the comparison address, a correction voltage value for each further component; and supplying each derived correction voltage to an associated further component.

27. In a control circuit for tuning a high-frequency input circuit, the input circuit having a voltage controlled oscillator and at least two voltage-controlled tunable filters, each of the voltage controlled oscillator and at least two voltage-controlled tunable filters having an adjustable frequency characteristic and containing at least one tuning element, and the input circuit being connected to receive a tuning control voltage for directly controlling the at least one tuning element of said voltage controlled oscillator and at least indirectly controlling the at least one tuning element of each of the at least two voltage-controlled tunable filters, the improvement wherein said control circuit comprises electronic tuning voltage control means and electronic stores, connected for supplying to each tuning element of said at least two voltage-controlled tunable filters a respective separate individually generated correction voltage, for individually adjusting the frequency characteristic of each of said at least two voltage-controlled tunable filters in a manner which is separate from the control effected by the tuning control voltage.

28. A control circuit as in claim 27, wherein said electronic tuning voltage control means is responsive to the tuning control voltage for supplying to each tuning element of said at least two voltage-controlled tunable filters the respective separate individually generated correction voltage and each value of the tuning control voltage is associated with a group of values of the correction voltages, said control circuit including an amplifier element associated with at least one of said at least two voltage-controlled tunable filters, said control circuit further comprising means for feeding an additional correction voltage to said amplifier element to control an amplification factor of said amplifier element for each value of the tuning control voltage and the group of associated values of the correction voltages.

* * * * *